(12) United States Patent
Lin

(10) Patent No.: US 10,985,761 B1
(45) Date of Patent: Apr. 20, 2021

(54) FRACTIONAL DIVIDER

(71) Applicant: Synopsys, Inc., Mountain View, CA (US)

(72) Inventor: James Lin, Richmond Hill (CA)

(73) Assignee: Synopsys, Inc., Mountain View, CA (US)

(*) Notice: Subject to any disclaimer, the term of this patent is extended or adjusted under 35 U.S.C. 154(b) by 14 days.

(21) Appl. No.: 16/426,728

(22) Filed: May 30, 2019

Related U.S. Application Data

(60) Provisional application No. 62/678,732, filed on May 31, 2018.

(51) Int. Cl.
   *H03K 21/02* (2006.01)
   *H04B 1/04* (2006.01)
   *H04L 29/08* (2006.01)

(52) U.S. Cl.
   CPC ......... *H03K 21/023* (2013.01); *H03K 21/026* (2013.01); *H04B 1/04* (2013.01); *H04L 69/324* (2013.01)

(58) Field of Classification Search
   None
   See application file for complete search history.

(56) References Cited

U.S. PATENT DOCUMENTS

| 9,490,826 | B1* | 11/2016 | Wang | H03L 7/099 |
| 2017/0038814 | A1* | 2/2017 | Pal | G06F 1/3237 |
| 2017/0279597 | A1* | 9/2017 | Park | H03B 27/00 |

* cited by examiner

*Primary Examiner* — Diane L Lo
(74) *Attorney, Agent, or Firm* — Sterne, Kessler, Goldstein & Fox P.L.L.C.

(57) ABSTRACT

A fractional divider is described herein which effectively performs an integer division followed by phase shifting, pulse swallowing, and/or multiplexing to realize a fractional divisor. The fractional divider divides an input clocking signal by a first integer divisor in a first mode of operation or by a second integer divisor in a second mode of operation to provide a first phase of a divided digital signal. Thereafter, the fractional divider shifts the first phase of the divided digital signal to provide a second phase of the divided digital signal in the first and second modes of operation. Finally, the fractional divider synchronizes an output clocking signal to the first phase of the divided digital signal and the second phase of the divided digital signal in the first and second modes of operation.

20 Claims, 9 Drawing Sheets

FRACTIONAL DIVIDER

CROSS-REFERENCE TO RELATED APPLICATIONS

The present application claims the benefit of U.S. Patent Appl. No. 62/678,732, filed on May 31, 2018, which is incorporated herein by reference in its entirety.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, headings should not be construed as necessarily limiting. In the following Background, Summary and Detailed Description, the citation or identification of any publication does not signify relevance or status as prior art for any of the claimed or described embodiments.

FIELD(S) OF TECHNOLOGY

This disclosure relates to the field of electronic signal generation, including using fractional dividers for electronic signal generation.

BACKGROUND

High speed signals, such as clock signals, are generally required to provide frequency and timing references for controlling internal processes on integrated circuits (ICs) with application in a wide range of products including computers, mobile devices, Internet of Things (IoT) to provide some examples. In the competitive market, manufacturers and/or designers of electronics devices strive to create better electronic devices from other manufacturers and/or designers. For example, an electronic device with faster performance can be a differentiator in the computer industry. As another example, an electronic device with smaller size and longer battery life would be highly valued features. These advantages can be realized in lower level building blocks which contribute to the overall performance of the electronics devices. For example, many electronics devices require some form of processing done through digital circuitry using various clocking signals. These various clocking signals can be generated through a frequency division process whereby a single clocking signal is divided into many clocking signals.

SUMMARY

The claims signify a brief description of one or more of the innovations, embodiments, and/or examples found within this disclosure. This disclosure describes a fractional frequency divider having an integer divider, a pulse swallower, a latch, and a multiplexer. The integer divider divides a digital input signal by a first integer divisor to provide a first phase of a divided input signal in a first mode of operation and a second integer divisor to provide a second phase of the divided input signal in a second mode of operation. The pulse swallower swallows a cycle of the digital input signal to increase the first integer divisor to be the second integer divisor in the second mode of operation. The latch phase shifts the first phase of the divided input signal to provide a third phase of the divided input signal in the first mode of operation and the second phase of the divided input signal to provide a fourth phase of the divided input signal in the second mode of operation. The multiplexer selects a digital output signal from among the first phase of the divided input signal and the third phase of the divided input signal in the first mode of operation and from among the second phase of the divided input signal and the fourth phase of the divided input signal in the second mode of operation.

This disclosure also describes a method for fractionally dividing a digital input signal. The method includes dividing the digital input signal by a first integer divisor to provide a first phase of a divided input signal, phase shifting the first phase of the divided input signal to provide a second phase of the divided input signal, synchronizing a first rising edge of a digital output signal to a rising edge of the first phase of the divided input signal and a first falling edge of the digital output signal to a falling edge of the second phase of the divided input signal, dividing the digital input signal by a second integer divisor to provide a third phase of the divided input signal, phase shifting the third phase of the divided input signal to provide a fourth phase of the divided input signal, and synchronizing a second rising edge of the digital output signal to a rising edge of the fourth phase of the divided input signal and a second falling edge of the digital output signal to a falling edge of the third phase of the divided input signal.

This disclosure further describes an Ethernet transmitter having a clock generator, a fractional divider, a media access controller (MAC), an encoder/scrambler, and a serializer. The clock generator generates a clocking signal. The fractional divider fractionally divides the clocking signal by a fractional divisor to provide a second clocking signal. The MAC utilizes the second clocking signal to encapsulate frame one or more data packets in accordance with a version of an Ethernet communication standard or protocol to provide one or more first data frames. The encoder/scrambler utilizes the second clocking signal to map the one or more first data frames from words to symbols and to scramble the mapped one or more first data frames symbols to provide one or more second data frames. The serializer utilizes clocking signal to convert the one or more second data frames from a parallel format to a serial format to provide one or more third data frames for transmission over a wired network.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the disclosure. All of the Figures signify innovations, embodiments, and/or examples of the disclosure for purposes of illustration only and do not limit the scope of the disclosure. Such Figures are not necessarily drawn to scale and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

Figure 7A:
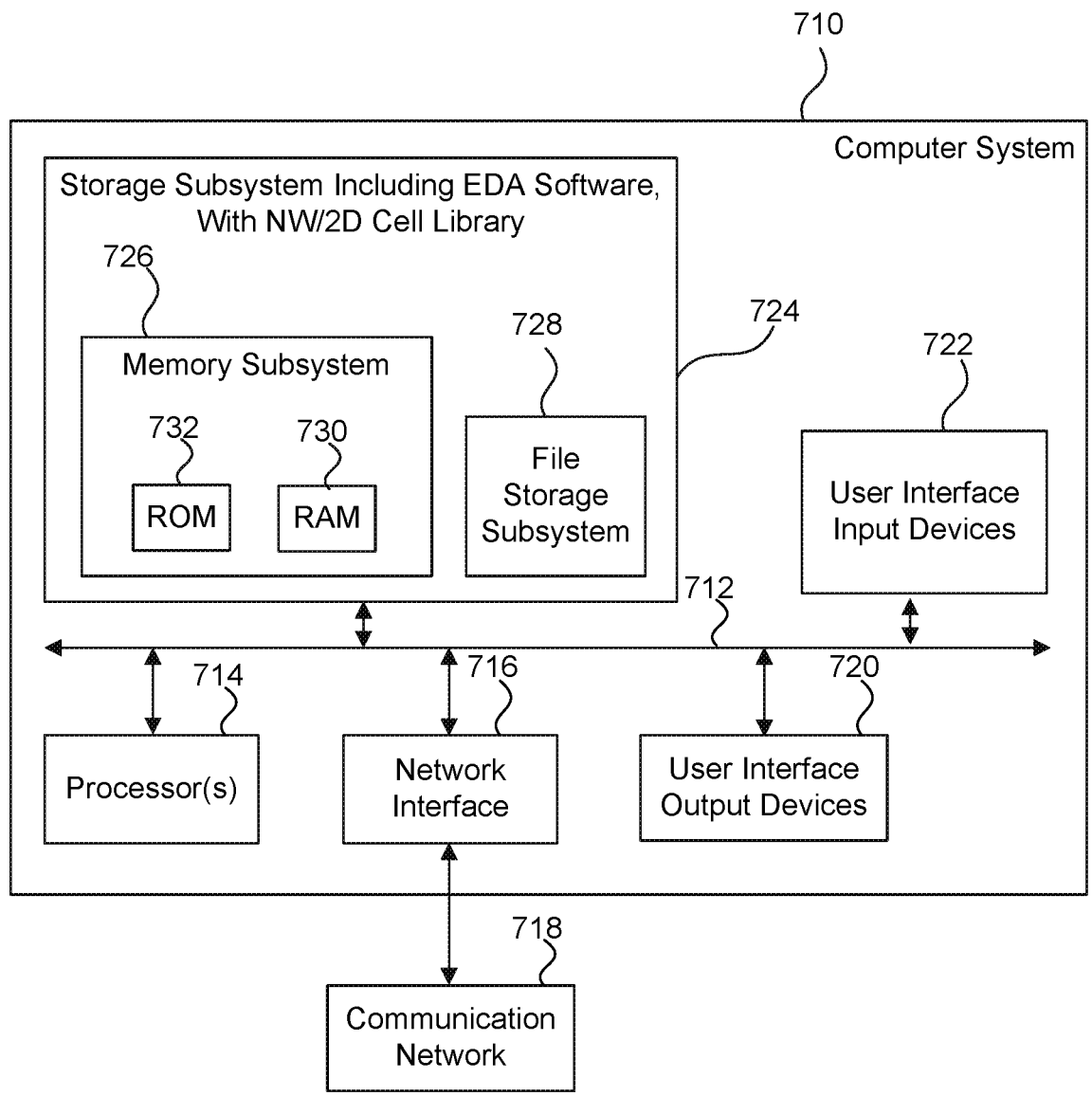
Figure 7B:
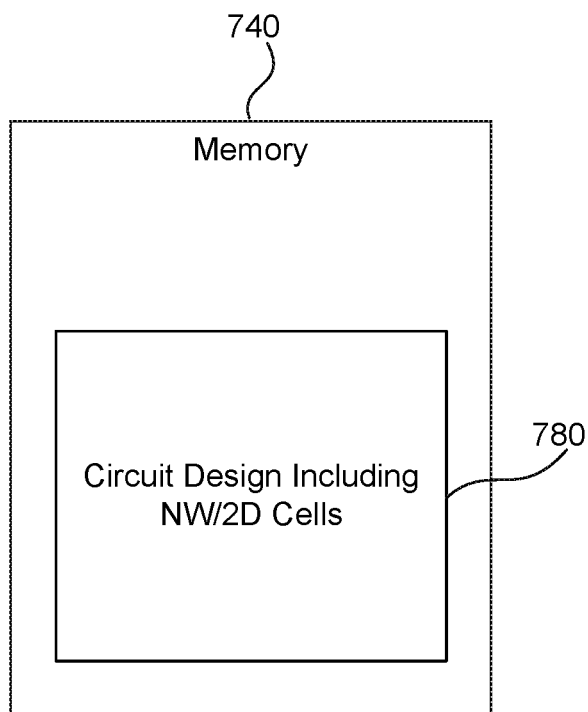
Figure 7C:
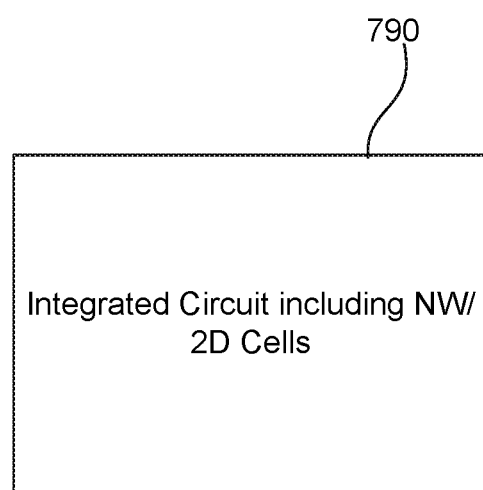
Figure 8:
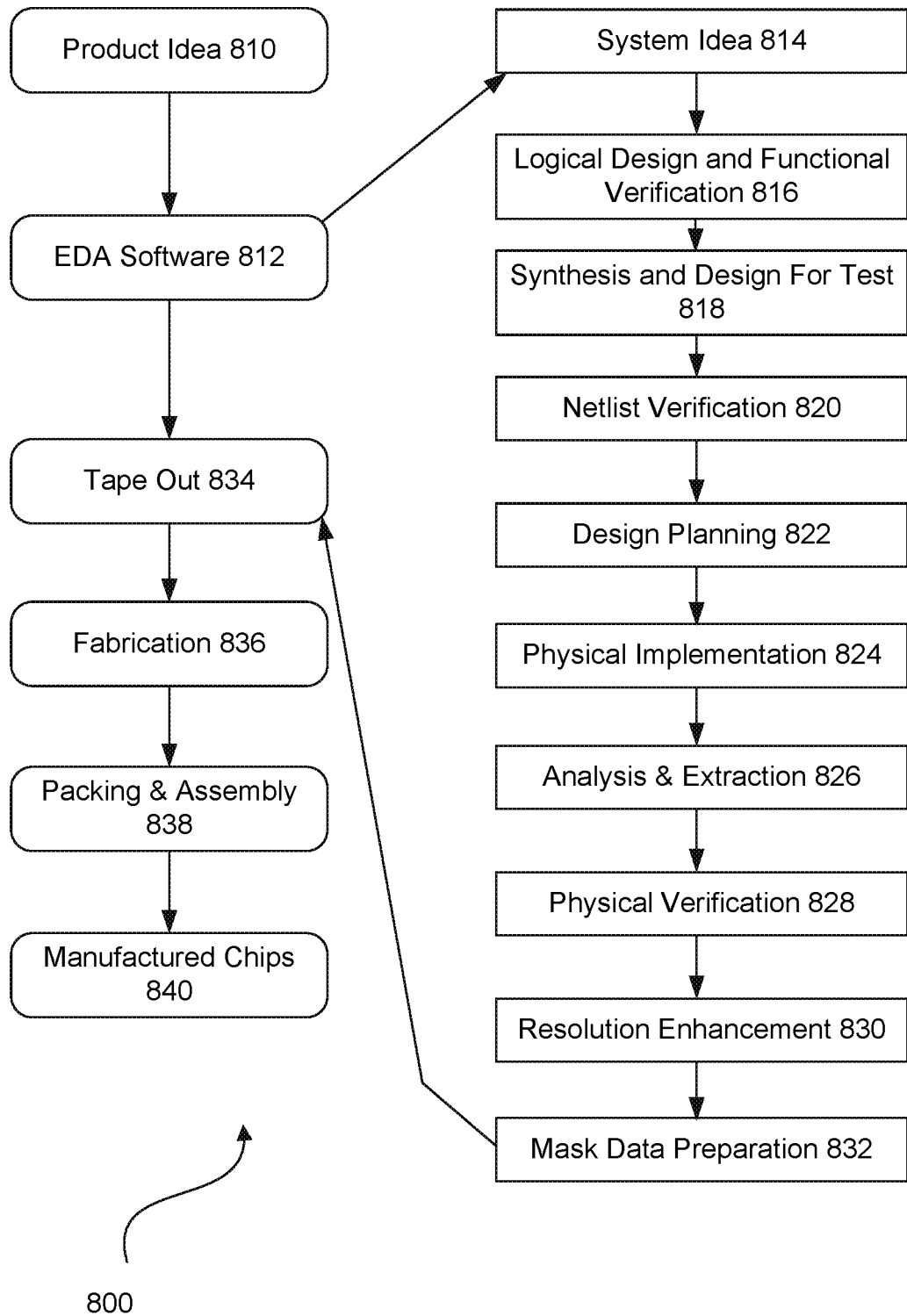

FIGS. 7A, 7B and 7C are simplified block diagrams of a computer system suitable for use with embodiments of the technology, as well as circuit design and circuit embodiments of the technology; and FIG. 8 illustrates various processes 800 performed in the design, verification and fabrication of an item of manufacture such as an integrated circuit using software tools with a computer, and possibly special hardware-assisted tools, to transform and verify design data and instructions that represent the integrated circuit.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

DETAILED DESCRIPTION—EXEMPLARY FRACTIONAL DIVIDER

Figure 1:
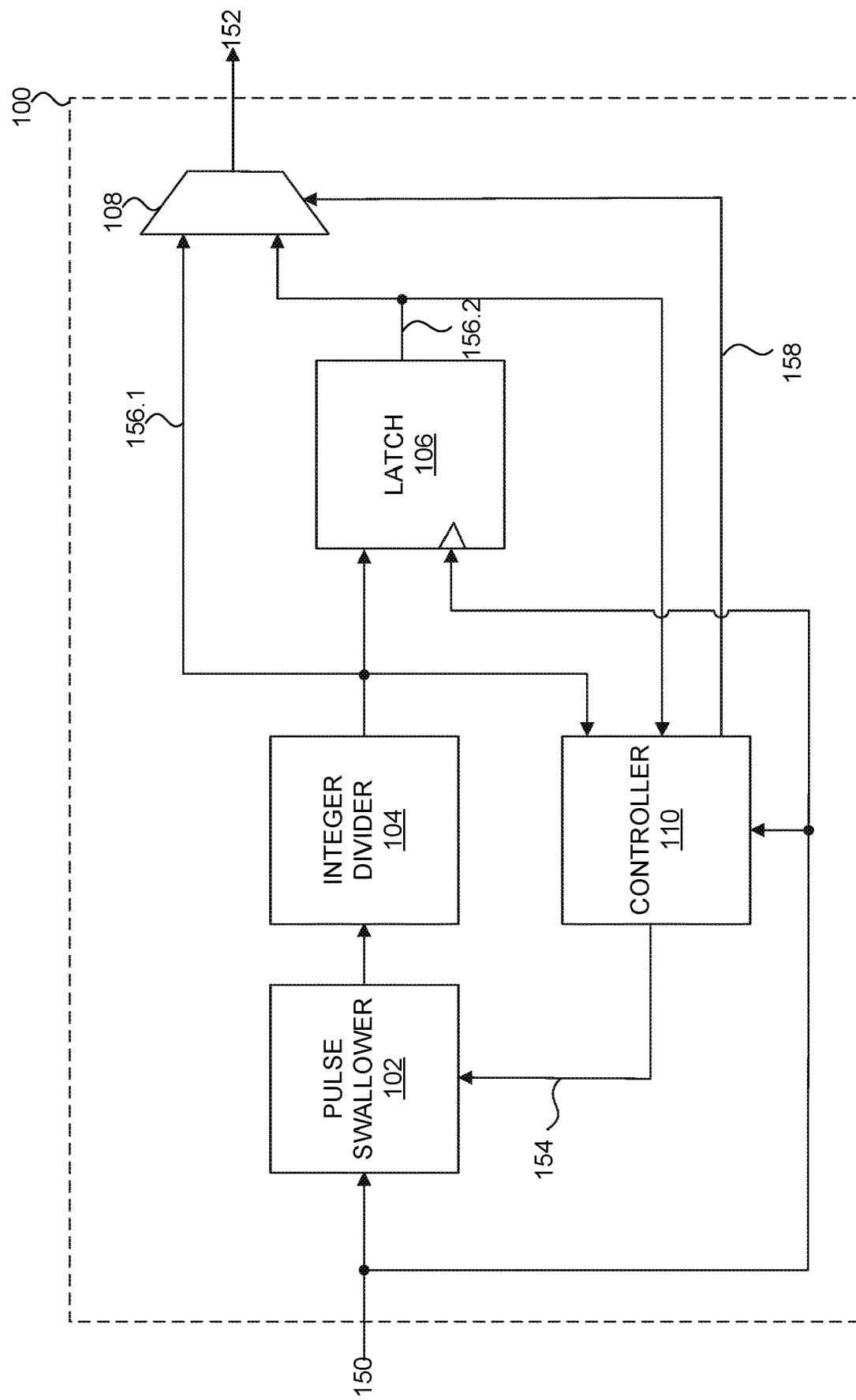
FIG. 1 is a block diagram of an exemplary fractional divider according to an exemplary embodiment of the present disclosure.

FIG. 1 is a block diagram of an exemplary fractional divider according to an exemplary embodiment of the present disclosure. As illustrated in FIG. 1, a fractional divider 100 fractionally divides a digital input signal 150 by a fractional divisor F, such as eight and one-half (8.5) or sixteen and one-half (16.5) to provide some examples, to provide a digital output signal 152. As to be described in further detail below, the fractional divider 100 effectively performs an integer division followed by phase shifting, pulse swallowing, and/or multiplexing to realize the fractional divisor F. In the exemplary embodiment illustrated in FIG. 1, the fractional divider 100 includes a pulse swallower 102, an integer divider 104, a latch 106, a multiplexer 108, and a controller 110. The pulse swallower 102, the integer divider 104, the latch 106, the multiplexer 108, and/or the controller 110 can be implemented in hardware, firmware, software, or any combination thereof. Moreover, the pulse swallower 102, the integer divider 104, the latch 106, the multiplexer 108, and/or the controller 110 can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc. The discussion of FIG. 1 to follow describes the overall operation of the fractional divider 100 with a specific example of this operation to be described in further detail below in FIG. 2. As to be described in further detail below, the fractional divider 100 operates in a first mode of operation or in a second mode of operation and can switch between these modes of operation to realize the fractional divisor F.

The pulse swallower 102, when enabled in the second mode of operation, prevents, also referred to as swallows, one cycle of the digital input signal 150 from transitioning between logical values. For example, the digital input signal 150 can be characterized as being a continuous series of N pulses which transition between logical values, such as between logical zero and logical one. In this example, the pulse swallower 102, when enabled, prevents one of these N pulses from transitioning between these logical values. Instead, this swallowed N pulse remains at its present logical value, for example, logical zero. Otherwise, the pulse swallower 102, when disabled in the first mode of operation, simply passes through the digital input signal 150 without any swallowing. In the exemplary embodiment illustrated in FIG. 1, the controller 110, which is to be described in further detail below, provides a swallow enable control signal 154 to disable the pulse swallower 102 in the first mode of operation and/or to enable the pulse swallower 102 in the second mode of operation.

The integer divider 104 divides the digital input signal 150 by an integer divisor N to provide a first phase of a divided digital signal 156.1 in the first mode of operation. However, in the second mode of operation, the pulse swallower 102 is enabled thereby swallowing one cycle of the digital input signal 150 as described above. This swallowing of the one cycle of the digital input signal 150 effectively increases the integer divisor N of the integer divider 104 by one such that the integer divider 104 divides the digital input signal 150 by an integer divisor N+1 in the second mode of operation to provide the first phase of the divided digital signal 156.1.

The latch 106 synchronizes the first phase of the divided digital signal 156.1 to the digital input signal 150 to provide a second phase of a divided digital signal 156.2. Specifically, the latch 106 synchronizes the first phase of the divided digital signal 156.1 to falling edges of the digital input signal 150 to effectively phase shift the first phase of the divided digital signal 156.1 by one-half cycle of the digital input signal 150 to provide the second phase of the divided digital signal 156.2. For example, the latch 106 captures a first logical value of the first phase of the divided digital signal 156.1 upon a first falling edge of the digital input signal 150 which is held by the latch 106 until a second falling edge of the digital input signal 150 whereby the latch 106 captures a second logical value of the first phase of the divided digital signal 156.1 to effectively phase shift the first phase of the divided digital signal 156.1 by one-half cycle in time to provide the second phase of the divided digital signal 156.2.

The multiplexer 108 selects the digital output signal 152 from among the first phase of the divided digital signal 156.1 and the second phase of the divided digital signal 156.2 in the first mode of operation and the second mode of operation. In the exemplary embodiment illustrated in FIG. 1, the multiplexer 108 selects the first phase of the divided digital signal 156.1 and switches to the second phase of the divided digital signal 156.2 to provide a first cycle of the digital output signal 152. In this example, the multiplexer 108 continues to select the divided digital signal 156.2 and switches to the first phase of the divided digital signal 156.1 to provide a second cycle of the digital output signal 152. As such, the first cycle of the digital output signal 152 effectively represents the first phase of the divided digital signal 156.1 followed by the second phase of the divided digital signal 156.2 and the second cycle of the digital output signal 152 effectively represents the second phase of the divided digital signal 156.2 followed by the first phase of the divided digital signal 156.1. This alternating selection between the first phase of the divided digital signal 156.1 and the second phase of the divided digital signal 156.2 causes rising edges and/or falling edges of the digital output signal 152 alternate between the rising edges and the falling edges of the digital input signal 150 to realize the fractional divisor F. For example, a rising edge of the first cycle of the digital output signal 152 is synchronized to a rising edge of the digital input signal 150 and a falling edge of the first cycle of the digital output signal 152 is synchronized to a falling edge of the digital input signal 150 whereas a rising edge of the second cycle of the digital output signal 152 is synchronized to a falling edge of the digital input signal 150 and a falling edge of the second cycle of the digital output signal 152 is synchronized to a rising edge of the digital input signal 150. This alternation between the rising edges and the falling edges effectively increases the integer divisor N that was used to generate the first phase of the divided digital signal 156.1 in the first mode of operation by one-half and decreases the integer divisor N+1 that was used to generate the first phase of the divided digital signal 156.1 in the second mode of operation by one-half to realize the fractional divisor F. A frequency of the digital output signal 152 in the first mode of operation can be represented by:

$$F_{CLK\_OUT} = \frac{1}{\left(M + \frac{N}{D}\right)} F_{CLK\_IN}. \tag{1}$$

And, a frequency of the digital output signal 152 in the second mode of operation can be represented by:

$$F_{CLK\_OUT} = \frac{1}{(M+1) - \left(1 - \frac{N}{D}\right)} F_{CLK\_IN}, \tag{2}$$

where $F_{CLK\_OUT}$ represents the frequency of the digital output signal 152, $F_{CLK\_IN}$ represents a frequency of the digital input signal 150, M represents an integer portion of the fractional divisor F, N represents the numerator portion of the fractional division, namely, one (1), and D representing the denominator portion of the fractional division, namely, two (2). In the exemplary embodiment illustrated in FIG. 1, the controller 110, which is to be described in further detail below, provides an output selection control signal 158 to cause the multiplexer 108 to select the first phase of the divided digital signal 156.1 or the second phase of the divided digital signal 156.2 in the second mode of operation.

The controller 110 controls overall configuration and/or operation of the fractional divider 100. As described above, the controller 110 provides the swallow enable control signal 154 to disable the pulse swallower 102 in the first mode of operation and/or to enable the pulse swallower 102 in the second mode of operation. In the exemplary embodiment illustrated in FIG. 1, the controller 110 switches between the first mode of operation and the second mode of operation in response to rising edges and/or falling edges of the first phase of the divided digital signal 156.1. For example, the controller 110 configures the swallow enable control signal 154 and the output selection control signal 158 to cause the fractional divider 100 to operate in the first mode of operation and thereafter re-configures the swallow enable control signal 154 and the output selection control signal 158 to cause the fractional divider 100 to operate in the first mode of operation in response to a rising edge of the first phase of the divided digital signal 156.1. And as described above, the controller 110 provides the output selection control signal 158 to cause the multiplexer 108 to select among the first phase of the divided digital signal 156.1 and the second phase of the divided digital signal 156.2. In the exemplary embodiment illustrated in FIG. 1, the controller 110 monitors the first phase of the divided digital signal 156.1 and the second phase of the divided digital signal 156.2. Thereafter, the controller 110 provides the output selection control signal 158 to cause the multiplexer 108 to switch between the first phase of the divided digital signal 156.1 and the second phase of the divided digital signal 156.2 when the first phase of the divided digital signal 156.1 and the second phase of the divided digital signal 156.2 are at equal logical values. In an exemplary embodiment, the controller 110 divides the first phase of the divided digital signal 156.1 by an integer divisor K, for example 2. In this exemplary embodiment, the controller 110 thereafter provides the output selection control signal 158 to cause the multiplexer 108 to switch from the first phase of the divided digital signal 156.1 to the second phase of the divided digital signal 156.2 in response to a rising edge and/or a falling edge of this divided first phase of the divided digital signal 156.1.

DETAILED DESCRIPTION—EXEMPLARY OPERATIONS OF THE EXEMPLARY FRACTIONAL DIVIDER

Figure 2:
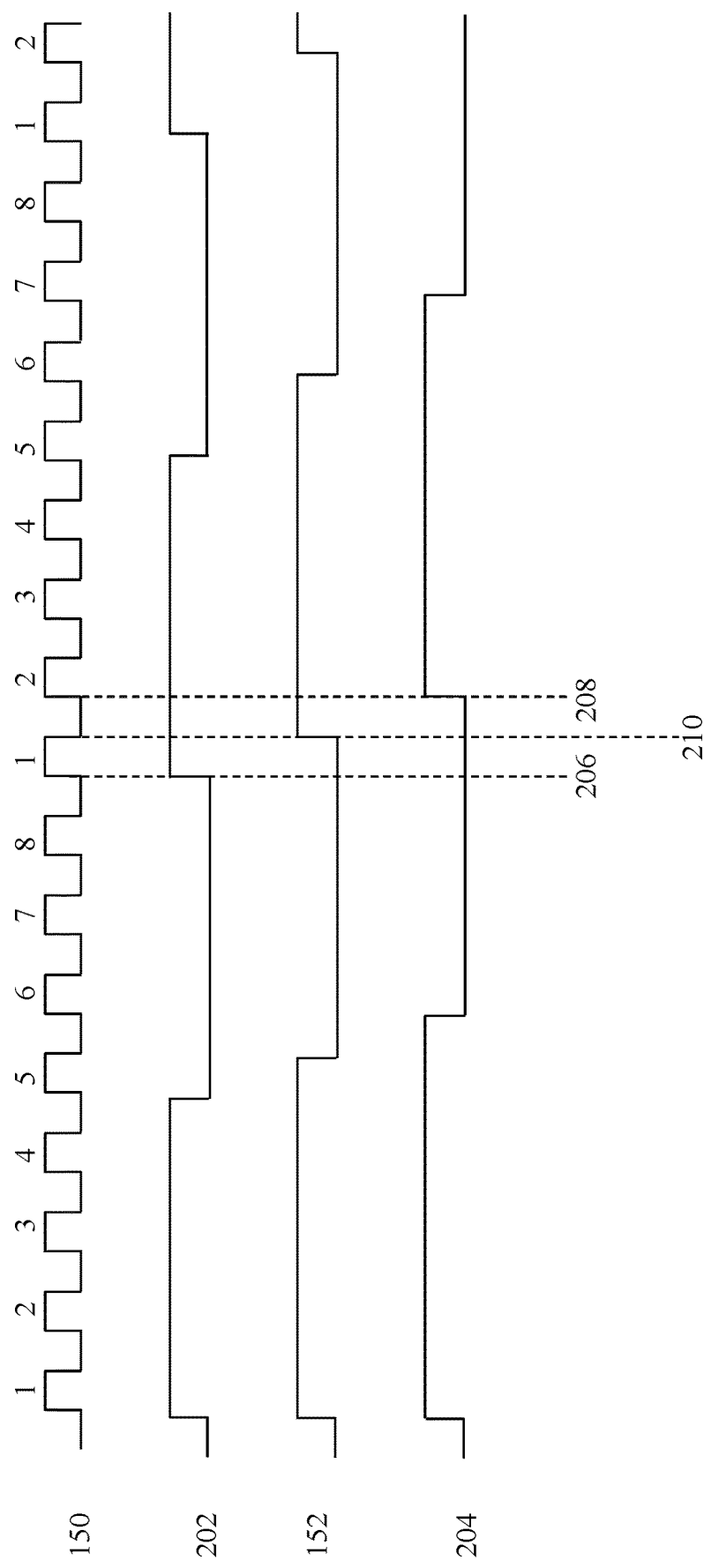
FIG. 2 is a first timing diagram illustrating a first exemplary operation of the exemplary fractional divider according to an exemplary embodiment of the present disclosure.

FIG. 2 is a first timing diagram illustrating a first exemplary operation of the exemplary fractional divider according to an exemplary embodiment of the present disclosure. As described above, the fractional divider 100 fractionally divides the digital input signal 150 by the fractional divisor F to provide the digital output signal 152. As illustrated in FIG. 2, the digital input signal 150 can be characterized as being a continuous series of eight (8) pulses which transition between logical values, such as between logical zero and logical one. As illustrated in FIG. 2, the fractional divider 100 fractionally divides the continuous series of eight (8) pulses of the digital input signal 150 by a fractional divisor of eight and one-half (8.5) to provide the digital output signal 152. In the exemplary embodiment illustrated in FIG. 2, the digital output signal 152 is illustrated with a first divided signal 202 that is generated through an integer division of the digital input signal 150 by a first integer divisor of 8 and a first divided signal 204 that is generated through an integer division of the digital input signal 150 by a second integer divisor of 9. As illustrated in FIG. 2, a rising edge of the first divided signal 202 is synchronous with a rising edge 206 of the digital input signal 150 and a rising edge of the second divided signal 204 is synchronous with a rising edge 208 of the digital input signal 150. However, a rising edge of the digital output signal 152 is synchronous with a falling edge 210 of the digital input signal 150 to realize the fractional divisor of eight and one-half (8.5). As to be described in further detail below in FIG. 3, the fractional divider 100 effectively performs an integer division of the digital input signal 150 followed by phase shifting, pulse swallowing, and/or multiplexing to realize the fractional divisor of eight and one-half (8.5).

Figure 3:
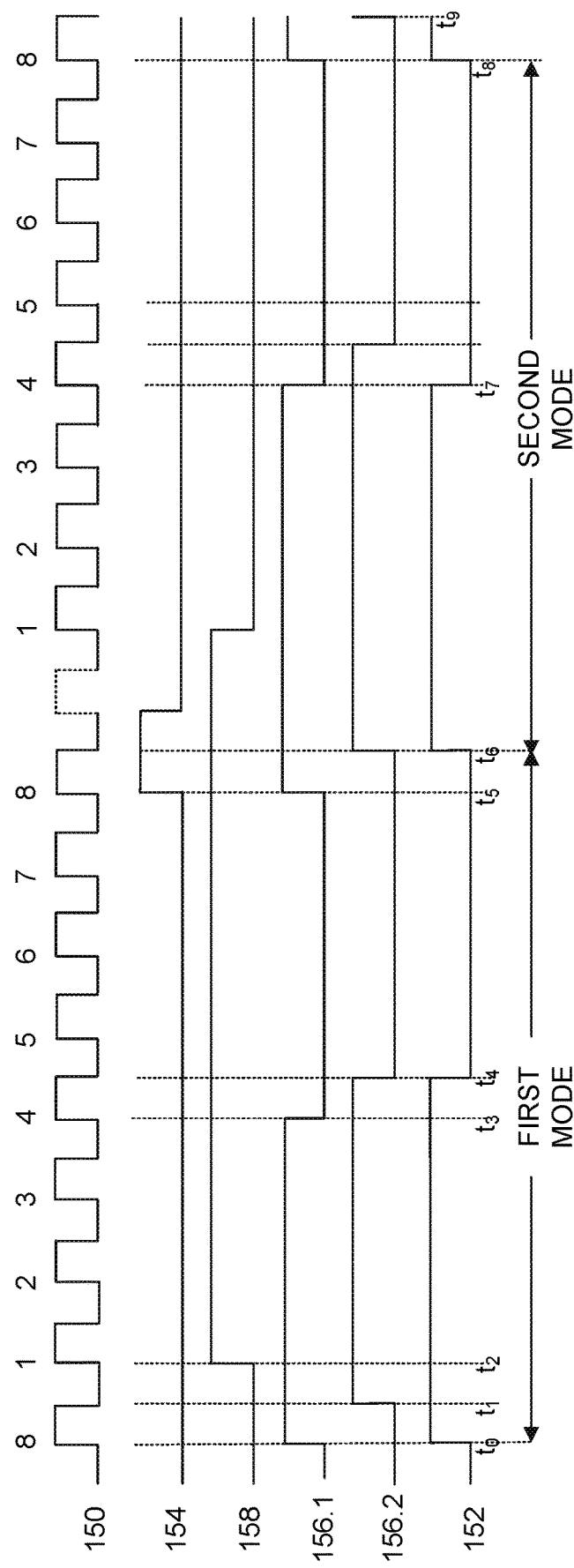
FIG. 3 is a timing diagram illustrating an exemplary operation of the exemplary fractional divider according to an exemplary embodiment of the present disclosure.

FIG. 3 is a timing diagram illustrating an exemplary operation of the exemplary fractional divider according to an exemplary embodiment of the present disclosure. As described above, the fractional divider 100 fractionally divides the digital input signal 150 by the fractional divisor F to provide the digital output signal 152. FIG. 3 graphically illustrates operation of the fractional divider 100 at various instances in times $t_0$ through $t_9$ in realizing a fractional divisor of 8.5. As described above, the fractional divider 100 operates in a first mode of operation or in a second mode of operation and can switch between these modes of operation to realize the fractional divisor 8.5.

As illustrated in FIG. 3, the digital input signal 150 can be characterized as being a continuous series of eight (8) pulses which transition between logical values, such as between logical zero and logical one. At time $t_0$, the fractional divider 100 is operating in the first mode of operation. In this mode of operation, the controller 110 provides the swallow enable control signal 154 to at a logical zero to disable the pulse swallower 102 and the output selection control signal 158 at a logical zero to cause the multiplexer 108 to select the first phase of the divided digital signal 156.1 to be the digital output signal 152 in the first mode of operation. The integer divider 104 divides the digital input signal 150 by an integer divisor of 8 to provide the first phase of the divided digital signal 156.1 in the first mode of operation. The latch 106 effectively shifts the first phase of the divided digital signal 156.1 to the time $t_1$ to provide the second phase of the divided digital signal 156.2 as described above. For example, as illustrated in FIG. 3, a rising edge of the first phase of the divided digital signal 156.1 is shifted in time from time $t_0$ to time $t_1$ and a falling edge of the first phase of the divided digital signal 156.1 is shifted in time from time $t_3$ to time $t_4$ to provide the second phase of the divided digital signal 156.2 having a rising edge at time $t_1$ and a falling edge at time $t_4$. Moreover, the multiplexer 108 selects the first phase of the divided digital signal 156.1 to be the digital output signal 152 at time $t_1$ in response to the output selection control signal 158 being at the logical zero. The controller 110 simultaneously monitors the first phase of the divided digital signal 156.1 and the second phase of the divided digital signal 156.2. Thereafter, the controller 110 asserts the output selection control signal 158 to be a logical one to cause the multiplexer 108 to select the second phase of the divided digital signal 156.2 the at some time between $t_1$ and $t_3$ when the first phase of the divided digital signal 156.1 and the second phase of the divided digital signal 156.2 are at equal logical values.

Next, the controller 110 provides the swallow enable control signal 154 at a logical one to enable the pulse swallower 102 to configure the fractional divider 100 to operate in the second mode of operation. As illustrated in FIG. 3, the controller 110 switches the swallow enable control signal 154 to be the logical one in response to a rising edge of the first phase of the divided digital signal 156.1 which occurs at time $t_6$. The pulse swallower 102, when enabled in the second mode of operation, prevents, also referred to as swallows, one cycle of the digital input signal 150, shown using dotted lines in FIG. 3, from transitioning between logical values to effectively increase the integer divisor of 8 by one such that the integer divider 104 divides the digital input signal 150 by an integer divisor of 9 in the second mode of operation to provide the first phase of the divided digital signal 156.1. The integer divider 104 divides the digital input signal 150 by the integer divisor of 9 to provide the first phase of the divided digital signal 156.1 in the second mode of operation. The latch 106 effectively shifts the first phase of the divided digital signal 156.1 to the time $t_6$ to provide the second phase of the divided digital signal 156.2 as described above. For example, as illustrated in FIG. 3, a rising edge of the first phase of the divided digital signal 156.1 is shifted in time from time $t_5$ to time $t_6$ and a falling edge of the first phase of the divided digital signal 156.1 is shifted in time from time $t_7$ to time $t_8$ to provide the second phase of the divided digital signal 156.2 having a rising edge at time $t_6$ and a falling edge at time $t_8$. Moreover, the multiplexer 108 selects the second phase of the divided digital signal 156.2 to be the digital output signal 152 at time $t_6$ in response to the output selection control signal 158 being at the logical one. The controller 110 simultaneously monitors the first phase of the divided digital signal 156.1 and the second phase of the divided digital signal 156.2. Thereafter, the controller 110 asserts the output selection control signal 158 to be a logical zero to cause the multiplexer 108 to select the first phase of the divided digital signal 156.2 at some time between $t_6$ and $t_7$ when the first phase of the divided digital signal 156.1 and the second phase of the divided digital signal 156.2 are at equal logical values.

As illustrated in FIG. 3, the fractional divider 100 effectively performs an integer division followed by phase shifting, pulse swallowing, and/or multiplexing to realize the fractional divisor F. As illustrated in FIG. 3, the rising edge of the digital output signal 152 at time $t_6$ is synchronized to a falling edge of the digital input signal 150 at time $t_6$ instead of a rising edge of the digital input signal 150 at time $t_5$. If the rising edge of the digital output signal 152 where to be at time $t_5$ as opposed to time $t_6$, this would represent an integer division of the digital input signal 150 by the integer divisor of 8. However, the shifting of the first phase of the divided digital signal 156.1 and/or the selection of between the first phase of the divided digital signal 156.1 and the second phase of the divided digital signal 156.1 in the first mode of operation as described above effectively shifts the rising edge of the digital output signal 152 to time $t_6$ which increases the integer divisor of 8 by one-half to effectively realize the fractional divisor of 8.5. Similarly, as illustrated in FIG. 3, the rising edge of the digital output signal 152 at time $t_8$ is synchronized to a rising edge of the digital input signal 150 at time $t_8$ instead of a falling edge of the digital input signal 150 at time $t_9$. If the rising edge of the digital output signal 152 where to be at time $t_9$ as opposed to time $t_8$, this would represent an integer division of the digital input signal 150 by the integer divisor of 9. However, the shifting of the first phase of the divided digital signal 156.1 and/or the selection of between the first phase of the divided digital signal 156.1 and the second phase of the divided digital signal 156.1 in the second mode of operation as described above effectively shifts the rising edge of the digital output signal 152 to time $t_8$ which decreases the integer divisor of 9 by one-half to effectively realize the fractional divisor of 8.5.

DETAILED DESCRIPTION—EXEMPLARY PULSE SWALLOWER THAT CAN BE IMPLEMENTED WITHIN THE EXEMPLARY FRACTIONAL DIVIDER

Figure 4:
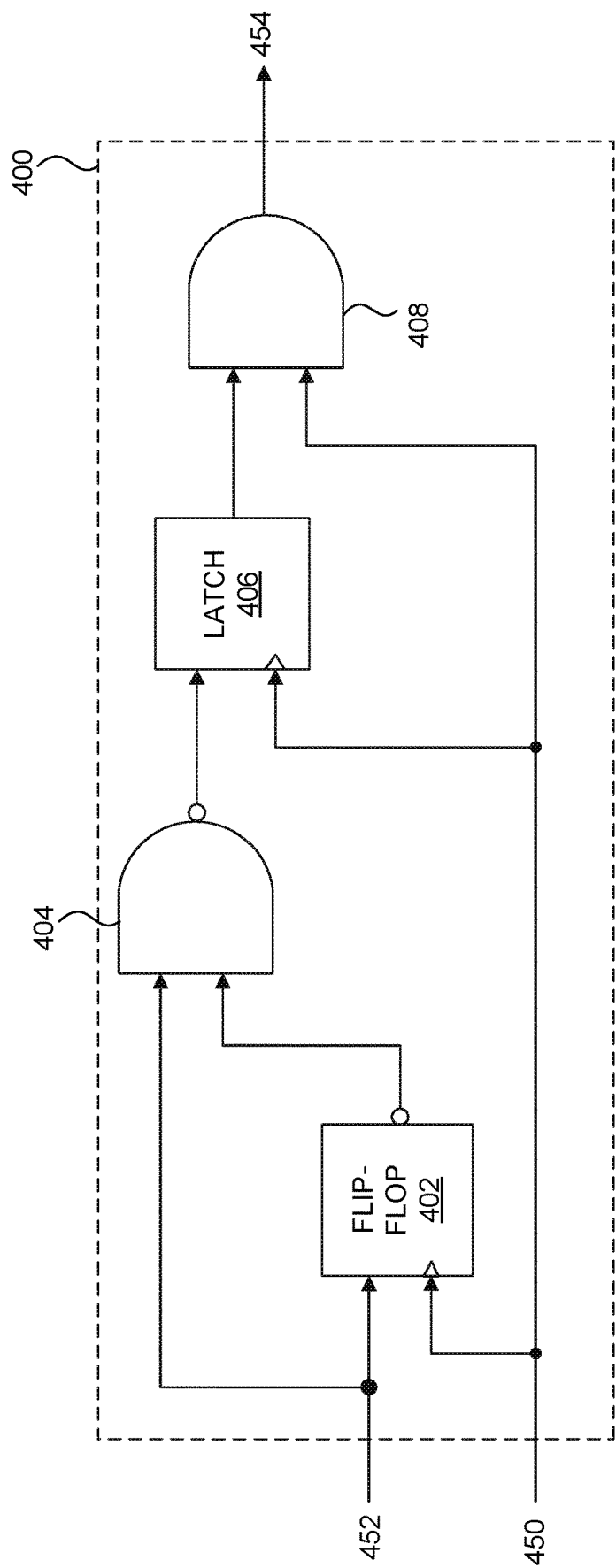
FIG. 4 is a block diagram of an exemplary pulse swallower that can be implemented within the exemplary fractional divider according to an exemplary embodiment of the present disclosure.

FIG. 4 is a block diagram of an exemplary pulse swallower that can be implemented within the exemplary fractional divider according to an exemplary embodiment of the present disclosure. As described above, a pulse swallower 400, when enabled, prevents, also referred to as swallows, one cycle of the digital input signal 150 from transitioning between logical values. Otherwise, the pulse swallower 400, when disabled, simply passes through the digital input signal 150 without any swallowing. In the exemplary embodiment illustrated in FIG. 4, the pulse swallower 400 includes a flip-flop 402, a logical NAND gate 404, a latch 406, and a logical AND gate 408. The pulse swallower 400 can represent an exemplary embodiment of the pulse swallower 104 as described above in FIG. 1.

As illustrated in FIG. 4, a swallowing event, namely, the swallowing of one clock cycle of an input clocking signal 450, such as the digital input signal 150 as described above, commences upon assertion of a control signal 452, such as the swallow enable control signal 154 as described above. In the exemplary embodiment illustrated in FIG. 4, the assertion of the control signal 452, namely, the transition from logical zero to logical one, causes an output of the flip-flop 402 to transition from a logical zero to a logical one upon a rising edge of the input clocking signal 450. The de-assertion of the control signal 452 namely, the transition from logical one to logical zero, causes the output of the flip-flop 402 to transition from a logical one to a logical zero upon the rising edge of the input clocking signal 450. As to described in further detail below, the pulse swallower 400 prevents, also referred to as swallows one cycle of the input clocking signal 450 from transitioning between logical values upon assertion of a control signal 452 and passes through the input clocking signal 450 upon de-assertion of the control signal 452.

In the exemplary embodiment illustrated in FIG. 4, the logical NAND gate 404 performs a logical NAND operation upon the control signal 452 and the output of the flip-flop 402. When the control signal 452 is asserted, the output of the flip-flop 402 transitions from the logical zero to the logical one upon the rising edge of the input clocking signal 450. In this situation, an output of the logical NAND gate 404 transitions from a logical one to a logical zero. Otherwise, when the control signal 452 is de-asserted, an output of the logical NAND gate 404 transitions from a logical zero to a logical one.

The latch 406 stores the output of the logical NAND gate 404 upon a falling edge of the input clocking signal 450. For example, when the control signal 452 is asserted, the output of the flip-flop 402 transitions from the logical zero to the logical one upon the rising edge of the input clocking signal 450 and the output of the logical NAND gate 404 transitions from a logical one to a logical zero. In this situation, an output of the latch 406 transitions from a logical one to a logical zero upon the falling edge of the clocking signal 450. Otherwise, when the control signal 452 is de-asserted, the output of the flip-flop 402 transitions from the logical one to the logical zero upon the rising edge of the input clocking signal 450 and the output of the logical NAND gate 404 transitions from a logical zero to a logical one. In this situation, the output of the latch 406 transitions from a logical zero to a logical one upon the falling edge of the clocking signal 450.

The logical AND gate 408 performs a logical AND operation upon the input clocking signal 450 and the output of the latch 406 to provide an output clocking signal 454. For example, when the control signal 452 is asserted, the output of the flip-flop 402 transitions from the logical zero to the logical one upon the rising edge of the input clocking signal 450, the output of the logical NAND gate 404 transitions from a logical one to a logical zero, and the output of the latch 406 transitions from a logical one to a logical zero upon the falling edge of the clocking signal 450. In this situation, logical AND gate 408 provides a logical zero as the output clocking signal 454 to effectively swallow the input clocking signal 450 while the control signal 452 is asserted. Otherwise, when the control signal 452 is deasserted, the output of the logical NAND gate 404 transitions from a logical zero to a logical one, and the output of the latch 406 transitions from a logical zero to a logical one upon the falling edge of the clocking signal 450. In this situation, logical AND gate 408 provides the input clocking signal 450 as the output clocking signal 454.

DETAILED DESCRIPTION—EXEMPLARY OPERATIONAL CONTROL FLOW FOR THE EXEMPLARY FRACTIONAL DIVIDER

Figure 5:
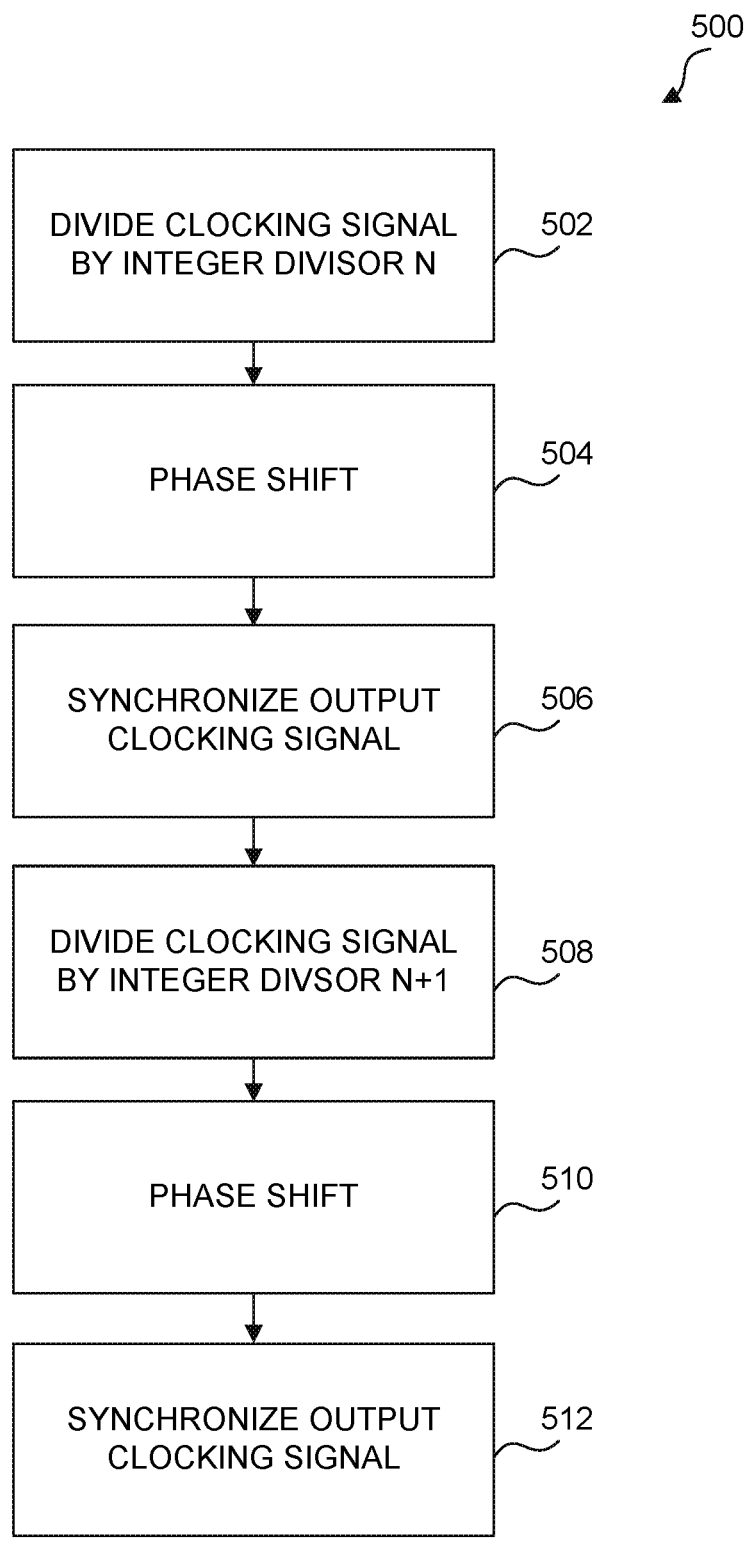
FIG. 5 illustrates a flowchart of exemplary operations for the exemplary fractional divider according to an exemplary embodiment of the present disclosure.

FIG. 5 illustrates a flowchart of exemplary operations for the exemplary fractional divider according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 500 for an exemplary fractional divider, such as the fractional divider 100 as described above in FIG. 1, in fractionally dividing an input clocking signal, such as the digital input signal 150, by a fractional divisor F, such as eight and one-half (8.5) or sixteen and one-half (16.5) to provide some examples, to provide an output clocking signal, such as the digital output signal 152.

At operation 502, the exemplary operational control flow 500 divides the input clocking signal by an integer divisor N to provide a first phase of a divided digital signal, such as the first phase of the divided digital signal 156.1.

At operation 504, the exemplary operational control flow 500 shifts the first phase of a divided digital signal in time to provide a second phase of the divided digital signal, such as the second phase of the divided digital signal 156.2.

At operation 506, the exemplary operational control flow 500 synchronizes an output clocking signal to the first phase of the divided digital signal from operation 502 and the second phase of the divided digital signal from operation 504. At operation 506, the exemplary operational control flow 500 synchronizes a rising edge of the digital output signal to a rising edge of the first phase of the divided digital signal from operation 502 and a falling edge of the digital output signal to a falling edge of the second phase of the divided digital signal from operation 504 to effectively fractionally divide the input clocking signal by the fractional divisor F. In an exemplary embodiment, the exemplary operational control flow 500 can utilize a multiplexer, such as the multiplexer 108 to provide an example, to select between the first phase of the divided digital signal from operation 502 and the second phase of the divided digital signal from operation 504. In this exemplary embodiment, the exemplary operational control flow 500 can select the first phase of the divided digital signal from operation 502 to synchronize the rising edge of the first phase of the divided digital signal from operation 502 and the rising edge of the digital output signal and thereafter select the second phase of the divided digital signal from operation 504 to synchronize the falling edge of the second phase of the divided digital signal from operation 504 and the falling edge of the digital output signal.

At operation 508, the exemplary operational control flow 500 divides the input clocking signal by an integer divisor N+1 to again provide the first phase of the divided digital signal, such as the first phase of the divided digital signal 156.1. In an exemplary embodiment, the exemplary operational control flow 500 can utilize a pulse swallower, such as the pulse swallower 102 to provide an example, to swallow one cycle of the input clocking signal to effectively increase the integer divisor N from operation 502 by one such that exemplary operational control flow 500 divides the input clocking signal by the integer divisor N+1 at operation 508.

At operation 510, the exemplary operational control flow 500 shifts the first phase of the divided digital signal in time to again provide the second phase of the divided digital signal, such as the second phase of the divided digital signal 156.2.

At operation 512, the exemplary operational control flow 500 again synchronizes the output clocking signal to the first phase of the divided digital signal from operation 508 and the second phase of the divided digital signal from operation 510. At operation 512, the exemplary operational control flow 500 synchronizes the rising edge of the digital output signal to a rising edge of the second phase of the divided digital signal from operation 510 and a falling edge of the digital output signal to a falling edge of the first phase of the divided digital signal from operation 508 to effectively fractionally divide the input clocking signal by the fractional divisor F. In an exemplary embodiment, the exemplary operational control flow 500 can utilize a multiplexer, such as the multiplexer 108 to provide an example, to select between the first phase of the divided digital signal from operation 508 and the second phase of the divided digital signal from operation 510. In this exemplary embodiment, the exemplary operational control flow 500 can select the second phase of the divided digital signal from operation 510 to synchronize the rising edge of the second phase of the divided digital signal from operation 510 and the rising edge of the digital output signal and thereafter select the first phase of the divided digital signal from operation 508 to synchronize the falling edge of the first phase of the divided digital signal from operation 508 and the falling edge of the digital output signal.

DETAILED DESCRIPTION—EXEMPLARY APPLICATION FOR THE EXEMPLARY FRACTIONAL DIVIDER

Figure 6:
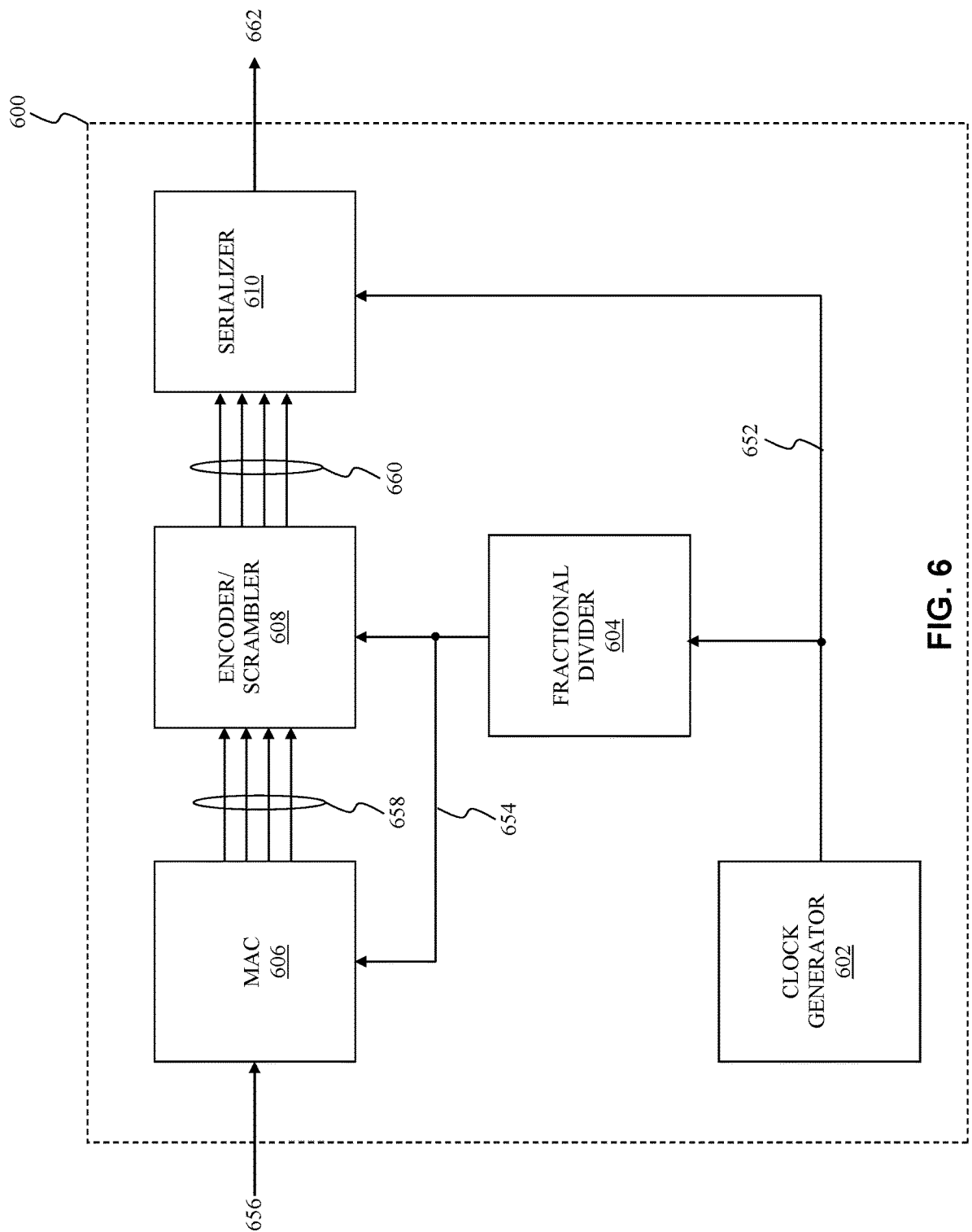
FIG. 6 illustrates a block diagram of an exemplary transmitter having the exemplary fractional divider according to an exemplary embodiment of the present disclosure.

FIG. 6 illustrates a block diagram of an exemplary transmitter having the exemplary fractional divider according to an exemplary embodiment of the present disclosure. In the exemplary embodiment illustrated in FIG. 6, a wired communication device 600 communicates information with one or more wired communication devices over a wired network in accordance with a wired communication standard or protocol. The wired communication device 600 can represent a computing device, such as a personal computing device to provide an example, peripherals, such as a printer, mouse, monitor, keyboard to provide some examples, for the computing device, a set-top box, a cable modem, a networking switch, a networking router, or any other electronic device that is capable of communicating over the wired network that will be apparent to those skilled in the relevant art(s) without departing from the spirit and scope of the present disclosure. The wired network can represent one or more personal area networks (PANs), one or more local area networks (LANs), one or more wide area networks (WANs), and/or any other suitable wired network, such as a telephone network, a cable television, an internet access network, and/or a fiber-optic communication network to provide some examples, that will be apparent to those skilled in the relevant art(s) without departing from the spirit and scope of the present disclosure. The wired communication standard or protocol can include Ethernet as defined in a version of an Institute of Electrical and Electronics Engineers (I.E.E.E.) 802.3 communication protocol, such as 10G Ethernet, 50G Ethernet, 100G Ethernet, 200G Ethernet, and/or 400G Ethernet to provide some examples, a Power over Ethernet communication protocol, a Point-to-Point Protocol over Ethernet (PPPoE) communication protocol, and/or any other suitable wired communication standard or protocol that will be apparent to those skilled in the relevant art(s) without departing from the spirit and scope of the present disclosure. As illustrated in FIG. 6, the wired communication device 600 includes a clock generator 602, a fractional divider 604, a media access controller (MAC) 606, an encoder/scrambler 608, and a serializer 610.

In the exemplary embodiment illustrated in FIG. 6, the clock generator 602, the fractional divider 604, the MAC 606, the encoder/scrambler 608, and/or the serializer 610 can be implemented in hardware, firmware, software, or any combination thereof. Moreover, the clock generator 602, the fractional divider 604, the MAC 606, the encoder/scrambler 608, and/or the serializer 610 can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

As illustrated in FIG. 6, the clock generator 602 generates a clocking signal 652. In an exemplary embodiment, the clocking signal 652 can be characterized as having a frequency of approximately 5.15625 Gigahertz (GHz) to be compliant with a 10G Ethernet wired communication standard or protocol. Preferably, the clock generator 602 can be implemented using a phased-locked loop (PLL) such as an analog phase-locked loop (APLL) also referred to as a linear phase-locked loop (LPLL), a digital phase-locked loop (DPLL), an all-digital phase-locked loop (ADPLL), and/or a software phase-locked loop (SPLL) to provide some examples. However, those skilled in the relevant art(s) will recognize the clock generator 602 can be implemented using other circuitry, such as any well-known crystal oscillator configuration and arrangement to provide an example, without departing from the spirit and scope of the present disclosure.

The fractional divider 604 fractionally divides the clocking signal 652 by a fractional divisor F to provide a clocking signal 654. From the exemplary embodiment above, fractional divider 604 fractionally divides the clocking signal 652 by sixteen and one-half (16.5) to provide the clocking signal 654 having a frequency of 312.5 Megahertz (MHz) to be compliant with the 10G Ethernet wired communication standard or protocol. The fractional divider 604 can represent an exemplary embodiment of the fractional divider 100 as described above. As such, the fractional divider 604 effectively performs the integer division followed by the phase shifting, the pulse swallowing, and/or the multiplexing to realize the fractional divisor F as described above in FIG. 1 through FIG. 5.

The MAC 606 utilizes the clocking signal 654 to encapsulate and/or frame one or more data packets 656 in accordance with the wired communication standard or protocol to the provide one or more data frames 658 to the encoder/scrambler 608. In the exemplary embodiment illustrated in FIG. 6, the one or more data frames 658 in a parallel format to the encoder/scrambler 608.

The encoder/scrambler 608 implements a line coding scheme utilizing the clocking signal 654 to map the one or more data frames 658 from words to symbols and thereafter scrambles the symbols to provide one or more data frames 660 to the serializer 610. In an exemplary embodiment, the encoder/scrambler 608 implements a 64B/66B line encoding scheme to map sixty-four (64) bit words of the one or more data frames 658 into sixty-six (64) bit symbols.

The serializer 610 utilizes clocking signal 652 to convert the one or more data frames 660 from the parallel format to a serial format to provide one or more data frames 662 for transmission over the wired network.

DETAILED DESCRIPTION—TECHNOLOGY SUPPORT GENERAL COMPUTER EXPLANATION

FIGS. 7A, 7B and 7C are simplified block diagrams of a computer system suitable for use with embodiments of the technology, as well as circuit design and circuit embodiments of the technology. As described above, the pulse swallower 102, the integer divider 104, the latch 106, the multiplexer 108, and/or the controller 110 can be implemented in hardware, firmware, software, or any combination thereof. The discussion of FIGS. 7A, 7B and 7C to follow describes computer system 710 that can be used for these implementations.

In FIG. 7A, computer system 710 typically includes at least one computer or processor 714 which communicates with a number of peripheral devices via bus subsystem 712. Typically, the computer can include, or the processor can be, any of a microprocessor, graphics processing unit, or digital signal processor, and their electronic processing equivalents, such as an Application Specific Integrated Circuit ('ASIC') or Field Programmable Gate Array ('FPGA'). The terms 'processor' and 'computer' are further defined below. These peripheral devices may include a storage subsystem 724, comprising a memory subsystem 726 and a file storage subsystem 728, user interface input devices 722, user interface output devices 720, and a network interface subsystem 716. The input and output devices allow user interaction with computer system 710.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the present disclosure are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 710 depicted in FIG. 7A is intended only as one example for purposes of illustrating the preferred embodiments. Many other configurations of computer system 710 are possible having more or less components than the computer system depicted in FIG. 7A.

Network interface subsystem 716 provides an interface to outside networks, including an interface to communication network 718, and is coupled via communication network 718 to corresponding interface devices in other computer systems or machines. Communication network 718 may comprise many interconnected computer systems, machines and communication links. These communication links may be wireline links, optical links, wireless links, or any other devices for communication of information. Communication network 718 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 722 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 710 or onto communication network 718. User interface input devices typically allow a user to select objects, icons, text and the like that appear on some types of user interface output devices, for example, a display subsystem.

User interface output devices 720 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 710 to the user or to another machine or computer system.

Memory subsystem 726 typically includes a number of memories including a main random-access memory ('RAM') 730 (or other volatile storage device) for storage of instructions and data during program execution and a read only memory (ROM') 732 in which fixed instructions are stored. File storage subsystem 728 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 728.

Bus subsystem 712 provides a device for letting the various components and subsystems of computer system 710 communicate with each other as intended. Although bus subsystem 712 is shown schematically as a single bus, alternative embodiments of the bus subsystem may use multiple busses. For example, RAM-based main memory can communicate directly with file storage systems using Direct Memory Access (DMA') systems.

FIG. 7B depicts a memory 740 such as a non-transitory, computer readable data and information storage medium associated with file storage subsystem 728, and/or with network interface subsystem 716, and can include a data structure specifying a circuit design. The memory 740 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 7C signifies an integrated circuit 790 created with the described technology that includes one or more cells selected, for example, from a cell library.

DETAILED DESCRIPTION—TECHNOLOGY SUPPORT HARDWARE/SOFTWARE EQUIVALENCE

As described above, Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term 'processor' can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. No scientific evidence exists that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence of transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The 'substance' of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term 'software application' signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the C programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

DETAILED DESCRIPTION—TECHNOLOGY SUPPORT EDA SYSTEM/WORKFLOW EXPLANATION

FIG. 8 illustrates various processes 800 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation'. These processes start with the creation of a product idea 810 with information supplied by a designer, information which is transformed during a process to create an item of manufacture (referred to herein as a design or device) that uses an EDA software tool 812, which may also be signified herein as EDA software, as a design tool, or a verification tool. When the design is finalized, it can be taped-out 834, which typically is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed, which result in the finished integrated circuit 840 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language ('HDL') such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level ('RTL') description, a gate-level description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, which is much used for detailed descriptions of analog-based circuits.

A design process that uses an EDA software tool 812 includes processes 814 to 832, which are described below. This design flow description is for illustration purposes only and is not meant to limit the present disclosure. For example, an actual integrated circuit design may require a designer to perform the design operations in a different sequence than the sequence described herein.

During system design 814, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 816, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (® signifies 'Registered Trademark').

During synthesis and design for test 818, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 820, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 822, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 824, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 826, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 828, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 830, geometric manipulations of the layout are performed to improve manufacturability of the design. Exemplary EDA software products from Synopsys, Inc. of Mountain View, Calif. that can be used at this stage include: *Proteus* products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 832, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above-mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 812.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION—CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of the disclosure comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein signify the principles of the disclosure and its useful application, thereby enabling others skilled in the art to understand how various embodiments and variations are suited to the particular uses signified.

The foregoing Detailed Description of innovations, embodiments, and/or examples of the disclosure have been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed:

1. A fractional frequency divider, comprising:
   an integer divider configured to divide a digital input signal by a first integer divisor to provide a first phase of a divided input signal in a first mode of operation and a second integer divisor to provide a second phase of the divided input signal in a second mode of operation;
   a pulse swallower configured to swallow a cycle of the digital input signal to increase the first integer divisor to be the second integer divisor in the second mode of operation;
   a latch configured to:
      generate a third phase of the divided input signal in the first mode of operation by phase shifting the first phase of the divided input signal; and
      generate a fourth phase of the divided input signal in the second mode of operation by phase shifting the second phase of the divided input signal; and
   a multiplexer configured to select a digital output signal from among the first phase of the divided input signal and the third phase of the divided input signal in the first mode of operation, and wherein the multiplexer is configured to select from among the second phase of the divided input signal and the fourth phase of the divided input signal in the second mode of operation.

2. The fractional frequency divider of claim 1, wherein the pulse swallower is further configured to pass through the digital input signal without any swallowing in the first mode of operation.

3. The fractional frequency divider of claim 1, wherein the pulse swallower is further configured to prevent the digital input signal from transitioning between logical values during the cycle in the second mode of operation.

4. The fractional frequency divider of claim 1, wherein the latch is further configured to:
   capture the first phase of the divided input signal upon a first falling edge of the digital input signal; and
   hold the captured first phase of the divided input signal until a second falling edge of the digital input signal to phase shift the first phase of the divided input signal by one-half cycle in time to provide the third phase of the divided input signal.

5. The fractional frequency divider of claim 1, wherein the multiplexer is further configured to select the first phase of the divided input signal to synchronize a first rising edge of the digital output signal to a rising edge of the first phase of the divided input signal and the third phase of the divided input signal to synchronize a first falling edge of the digital output signal to a falling edge of the third phase of the divided input signal in the first mode of operation.

6. The fractional frequency divider of claim 5, wherein the multiplexer is further configured to select the fourth phase of the divided input signal to synchronize a second rising edge of the digital output signal to a rising edge of the fourth phase of the divided input signal and the second phase of the divided input signal to synchronize a second falling edge of the digital output signal to a falling edge of the second phase of the divided input signal in the second mode of operation.

7. The fractional frequency divider of claim 1, further comprising:
a controller configured to cause the fractional frequency divider to switch from the first mode of operation to the second mode of operation in response to a rising edge of the first phase of the divided input signal.

8. The fractional frequency divider of claim 1, further comprising:
a controller configured to:
monitor the first phase of the divided input signal and the third phase of the divided input signal in the first mode of operation, and
cause the multiplexer configured to select the first phase of the divided input signal as the digital output signal and to switch from the first phase of the divided input signal to the third phase of the divided input signal when the first phase of the divided input signal and the third phase of the divided input signal are at equal logical values in the first mode of operation.

9. The fractional frequency divider of claim 8, wherein the controller is further configured to:
monitor the second phase of the divided input signal and the fourth phase of the divided input signal in the second mode of operation; and
cause the multiplexer configured to select the fourth phase of the divided input signal as the digital output signal and to switch from the fourth phase of the divided input signal to the second phase of the divided input signal when the second phase of the divided input signal and the fourth phase of the divided input signal are at equal logical values in the second mode of operation.

10. A method for fractionally dividing a digital input signal, the method comprising:
dividing, by a fractional frequency divider, the digital input signal by a first integer divisor to provide a first phase of a divided input signal;
phase shifting, by the fractional frequency divider, the first phase of the divided input signal to provide a second phase of the divided input signal;
synchronizing, by the fractional frequency divider, a first rising edge of a digital output signal to a rising edge of the first phase of the divided input signal and a first falling edge of the digital output signal to a falling edge of the second phase of the divided input signal by multiplexing using a multiplexer of the fractional frequency divider;
dividing, by the fractional frequency divider, the digital input signal by a second integer divisor to provide a third phase of the divided input signal;
phase shifting, by the fractional frequency divider, the third phase of the divided input signal to provide a fourth phase of the divided input signal; and
synchronizing, by the fractional frequency divider, a second rising edge of the digital output signal to a rising edge of the fourth phase of the divided input signal and a second falling edge of the digital output signal to a falling edge of the third phase of the divided input signal by multiplexing using the multiplexer.

11. The method of claim 10, wherein the dividing the digital input signal by the second integer divisor comprises:
swallowing a cycle of the digital input signal to increase the first integer divisor to be the second integer divisor.

12. The method of claim 11, wherein the swallowing comprises:
preventing the digital input signal from transitioning between logical values during the cycle.

13. The method of claim 10, wherein the phase shifting the first phase of the divided input signal comprises:
capturing the first phase of the divided input signal upon a first falling edge of the digital input signal; and
holding the captured first phase of the divided input signal until a second falling edge of the digital input signal to phase shift the first phase of the divided input signal by one-half cycle in time to provide the third phase of the divided input signal.

14. The method of claim 10, wherein the synchronizing the first rising edge of the digital output signal comprises:
selecting, by the multiplexer, the first phase of the divided input signal to synchronize a first rising edge of the digital output signal to a rising edge of the first phase of the divided input signal; and
selecting, by the multiplexer, the third phase of the divided input signal to synchronize a first falling edge of the digital output signal to a falling edge of the third phase of the divided input signal.

15. The method of claim 14, wherein the synchronizing the second rising edge of the digital output signal comprises:
selecting, by the multiplexer, the fourth phase of the divided input signal to synchronize a second rising edge of the digital output signal to a rising edge of the fourth phase of the divided input signal; and
selecting, by the multiplexer, the second phase of the divided input signal to synchronize a second falling edge of the digital output signal to a falling edge of the second phase of the divided input signal.

16. The method of claim 10, further comprising:
monitoring the first phase of the divided input signal and the third phase of the divided input signal, and
wherein the synchronizing the first rising edge of the digital output signal comprises:
selecting the first phase of the divided input signal as the digital output signal; and
switching from the first phase of the divided input signal to the third phase of the divided input signal when the first phase of the divided input signal and the third phase of the divided input signal are at equal logical values.

17. The method of claim 10, further comprising:
monitoring the second phase of the divided input signal and the fourth phase of the divided input signal; and
wherein the synchronizing the second rising edge of the digital output signal comprises:
selecting the fourth phase of the divided input signal as the digital output signal; and
switching from the fourth phase of the divided input signal to the second phase of the divided input signal when the second phase of the divided input signal and the fourth phase of the divided input signal are at equal logical values.

18. An Ethernet transmitter, comprising:
a clock generator configured to generate a clocking signal;
a fractional divider configured to fractionally divide the clocking signal by a fractional divisor to provide a second clocking signal, the fractional divider comprising:

an integer divider configured to divide the clocking signal by a first integer divisor to provide a first phase of a divided input signal in a first mode of operation and a second integer divisor to provide the first phase of the divided input signal in a second mode of operation, a pulse swallower configured to swallow a cycle of the clocking signal to increase the first integer divisor to be the second integer divisor in the second mode of operation, a latch configured to phase shift the first phase of the divided input signal to provide a third phase of the divided input signal in the first mode of operation and the second phase of the divided input signal to provide a fourth phase of the divided input signal in the second mode of operation, and a multiplexer configured to select a digital output signal from among the first phase of the divided input signal and the third phase of the divided input signal in the first mode of operation and from among the second phase of the divided input signal and the fourth phase of the divided input signal in the second mode of operation to provide the second clocking signal;

a media access controller (MAC) configured to utilize the second clocking signal to encapsulate frame one or more data packets in accordance with a version of an Ethernet communication standard or protocol to provide one or more first data frames;

an encoder/scrambler configured to utilize the second clocking signal to map the one or more first data frames from words to symbols and to scramble the mapped one or more first data frames symbols to provide one or more second data frames; and a serializer configured to utilize clocking signal to convert the one or more second data frames from a parallel format to a serial format to provide one or more third data frames for transmission over a wired network.

19. The Ethernet transmitter of claim 18, wherein the multiplexer is configured to:

select the first phase of the divided input signal to synchronize a first rising edge of the digital output signal to a rising edge of the first phase of the divided input signal and the third phase of the divided input signal to synchronize a first falling edge of the digital output signal to a falling edge of the third phase of the divided input signal in the first mode of operation.

20. The Ethernet transmitter of claim 19, wherein the multiplexer is further configured to:

select the fourth phase of the divided input signal to synchronize a second rising edge of the digital output signal to a rising edge of the fourth phase of the divided input signal and the second phase of the divided input signal to synchronize a second falling edge of the digital output signal to a falling edge of the second phase of the divided input signal in the second mode of operation.

\* \* \* \* \*